US012609182B2

(12) United States Patent
Michioka

(10) Patent No.: US 12,609,182 B2
(45) Date of Patent: Apr. 21, 2026

(54) SEMICONDUCTOR MEMORY DEVICE AND CONTROL METHOD OF THE SAME

(71) Applicant: Winbond Electronics Corp., Taichung City (TW)

(72) Inventor: Yoshihisa Michioka, Yokohama (JP)

(73) Assignee: WINBOND ELECTRONICS CORP., Taichung City (TW)

( * ) Notice: Subject to any disclaimer, the term of this patent is extended or adjusted under 35 U.S.C. 154(b) by 79 days.

(21) Appl. No.: 18/650,942

(22) Filed: Apr. 30, 2024

(65) Prior Publication Data

US 2024/0379184 A1      Nov. 14, 2024

(30) Foreign Application Priority Data

May 9, 2023      (JP) ................................. 2023-077223

(51) Int. Cl.
*G11C 29/02*          (2006.01)
*G11C 29/00*          (2006.01)

(52) U.S. Cl.
CPC .......... *G11C 29/702* (2013.01); *G11C 29/022* (2013.01); *G11C 29/76* (2013.01)

(58) Field of Classification Search
CPC ..... G11C 29/702; G11C 29/022; G11C 29/76; G11C 2029/1204; G11C 11/4085; G11C 11/4094; G11C 29/025; G11C 11/4087; G11C 11/4091; G11C 11/4097; G11C 2029/1202
See application file for complete search history.

(56) References Cited

U.S. PATENT DOCUMENTS

| | | | | |
|---|---|---|---|---|
| 9,583,161 | B1 * | 2/2017 | Kim | ..................... G11C 29/781 |
| 2006/0285412 | A1 | 12/2006 | Hummler | |
| 2017/0116076 | A1 * | 4/2017 | Sharma | .................. G11C 29/44 |

FOREIGN PATENT DOCUMENTS

| | | | |
|---|---|---|---|
| JP | 2001-67889 A | 3/2001 | |
| TW | 343307 B | 10/1998 | |
| TW | 200636721 A | 10/2006 | |

* cited by examiner

*Primary Examiner* — Mohammed A Bashar
(74) *Attorney, Agent, or Firm* — Birch, Stewart, Kolasch & Birch, LLP

(57)          ABSTRACT

A semiconductor memory device and control method thereof are provided, repairing defective bit lines even if the number of defective bit lines exceeds that of a spare bit line in any subarray in multiple subarrays. The semiconductor memory device includes a memory cell array having multiple subarrays, and a controller, configured to activate the word line and a corresponding word line in a second subarray which is separately arranged from the first subarray in a column direction when activating any word line in a first subarray of the plurality of subarrays. The controller is further configured to access the memory cells connected to the activated word line in the second subarray instead of the memory cells connected to the activated word line in the first subarray when a first condition (i.e., the number of defective bit lines exceeds the number of spare bit lines in the first subarray) is met.

20 Claims, 9 Drawing Sheets

| | SAA | | SAA | | | | SAA | |
|---|---|---|---|---|---|---|---|---|
| WLDA | A11 | WLDA | A21 | WLDA | . . . . . | WLDA | | WLDA |
| | SAA | | SAA | | | | SAA | |
| WLDA | A12 | WLDA | A22 | WLDA | . . . . . | WLDA | | WLDA |
| | SAA | | SAA | | | | SAA | |
| WLDA | A13 | WLDA | A23 | WLDA | . . . . . | WLDA | | WLDA |
| | SAA | | SAA | | | | SAA | | wl_2 wl_1

SEMICONDUCTOR MEMORY DEVICE AND CONTROL METHOD OF THE SAME

CROSS REFERENCE TO RELATED APPLICATIONS

This Application claims priority of Japan Patent Application No. 2023-077223, filed on May 9, 2023, the entirety of which is incorporated by reference herein.

BACKGROUND OF THE INVENTION

Field of the Invention

The present invention relates to a semiconductor memory and method for controlling the same, and in particular, it relates to a semiconductor memory and a control method of the same, to rescue defective bit lines efficiently.

Description of the Related Art

In conventional semiconductor memory devices, defective bit lines (bad columns) in a memory cell array can be rescued by some well-known methods (for example, Japan laid-open patent application No. 2001-67889). When a memory cell array in a conventional semiconductor memory device is composed of multiple subarrays, the method of rescuing defective bit lines is applied to each of the multiple subarrays. However, in conventional semiconductor memory devices, when the number of defective bit lines in any one subarray exceeds the number of spare bit lines (redundant bit lines) arranged in the subarray, it might be difficult to rescue the defective bit lines.

In addition, as semiconductor memory devices become more miniaturized, the occurrence probability of bad columns is higher. To maintain the same repair rate, more spare bit lines need to be provided, which makes miniaturization harder, as well as increases the cost and resource of manufacturing the semiconductor memory devices.

BRIEF SUMMARY OF THE INVENTION

In view of the above problems, the present invention provides a semiconductor memory device and a control method thereof. According to the disclosure of present invention, even when the number of defective bit lines in any of the multiple subarrays exceeds the number of spare bit lines arranged in the subarray, the defective bit lines can be rescued, thus contributing to the miniaturization of the semiconductor memory device.

To solve the problem mentioned above, the present invention provides a semiconductor memory device, including a memory cell array and a control circuit. The memory cell array includes a first subarray and a second subarray arranged apart from the first subarray in a column direction. Each of the first subarray and the second subarray include a plurality of word lines, a plurality of bit lines, at least one spare bit line for replacing at least one defective bit line, and a plurality of memory cells connected to the word lines, and the bit lines or the at least one spare bit line. The control circuit is coupled to the memory cell array, and is configured to activate one of the plurality of word lines in the first subarray and a corresponding one of the plurality of word lines in the second subarray when receives a read command for reading the one of the plurality of word lines in the first subarray. Wherein, in the first subarray when the number of the at least one defective bit line is higher than the number of the at least one spare bit line, the control circuit is configured to access the memory cells connected to the activated corresponding one of the plurality of word lines in the second subarray instead of the first subarray.

In addition, the present invention provides a control method of a semiconductor memory device having a memory cell array including a first subarray and a second subarray arranged apart from the first subarray in a column direction. The control method includes: activating a word line in the first subarray and a corresponding word line in the second subarray when receives a read command for reading the word line in the first subarray; and accessing a plurality of memory cells connected to the activated corresponding word line in the second subarray instead of the first subarray when the number of at least one defective bit line in the first subarray is higher than the number of at least one spare bit line in the first subarray.

According to the present invention, even when the number of defective bit lines in the first subarray is higher than the number of spare bit lines in the first sub-array, the memory cells in the second subarray can be accessed to replace the memory cells in the first subarray. Thereby, the reliability and repair efficiency of the semiconductor memory device of the present invention are improved.

BRIEF DESCRIPTION OF THE DRAWINGS

FIG. 1 shows a structural example of a memory cell array provided in a semiconductor memory device according to a first embodiment of the present invention.

FIG. 3 illustrates an example when activating a word line in any subarray also activates word lines in other subarrays.

DETAILED DESCRIPTION OF THE INVENTION

Figure 1:
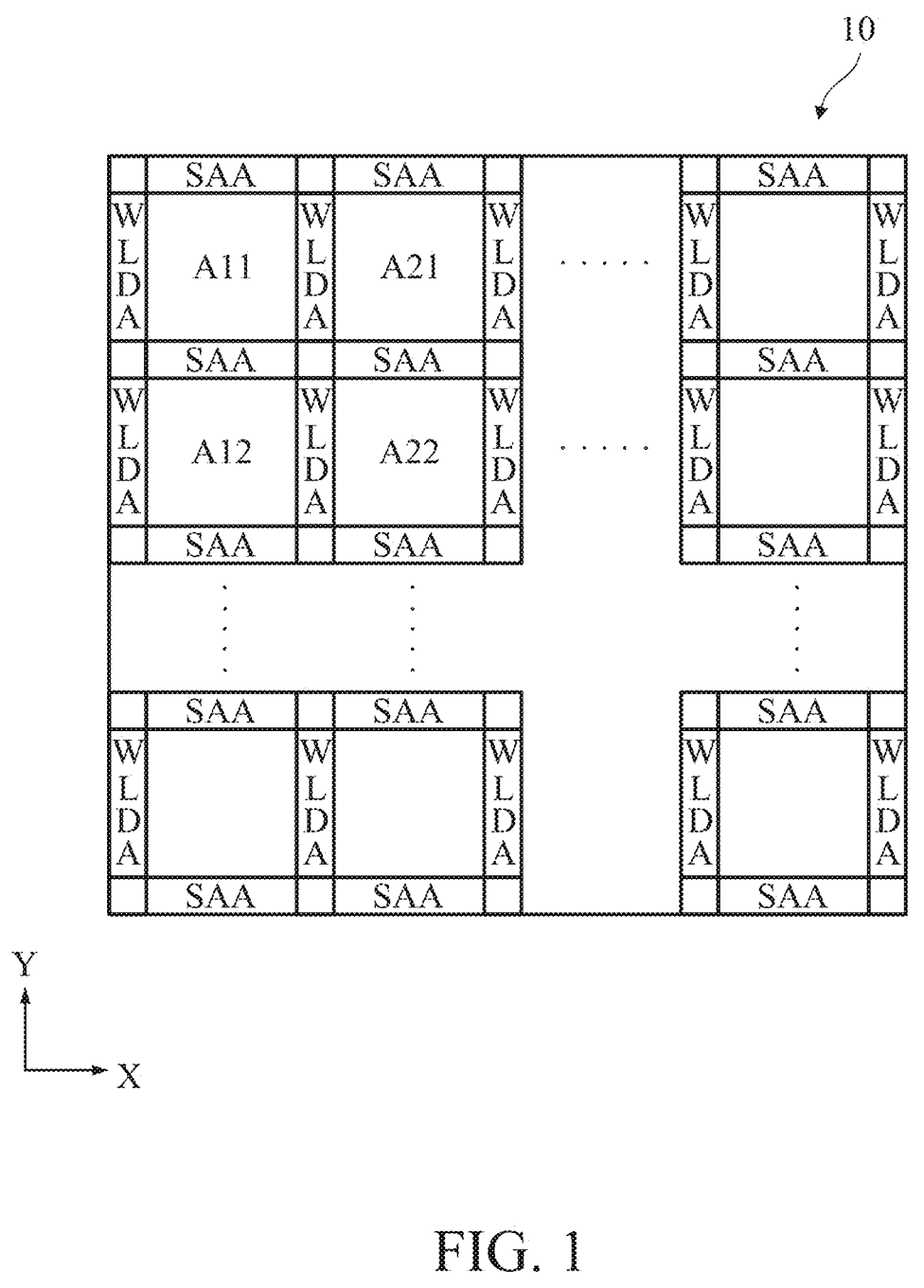

In FIG. 1, according to the first embodiment of the present invention, in a semiconductor memory device, the memory cell array 10 includes a plurality of sense amplifier rows SAA, and a plurality of word line driver rows WLDA. The plurality of sense amplifier rows SAA extend in the X direction (row direction of the matrix), and also are spaced apart in the Y direction (column direction of the matrix). The plurality of word line driver rows WLDA extend in the Y direction, and also are spaced apart in the X direction. In addition, the sections surrounded by the sense amplifier rows SAA and the word line driver rows WLDA are configured to have corresponding subarrays A11, A12, A21, A22, . . . , respectively (for brevity, only 4 subarrays are marked in FIG. 1).

In this embodiment, although arranging multiple subarrays A11, A12, A21, A22 . . . in the memory cell array 10 is an example, in some examples, the memory cell array 10 may include multiple memory banks, and multiple subarrays are provided in each memory bank.

Further, in this embodiment, although the semiconductor memory device is a DRAM (Dynamic Random Access Memory) for example, the semiconductor memory device may a SRAM (Static Random Access Memory), Flash memory, etc.

In addition, in this embodiment, to simplify the description, detailed descriptions of other well-known circuits (for example, power supply circuits, command decoders, address decoders, clock generators, etc.) in the semiconductor memory device such as DRAM will be omitted.

Figure 2:
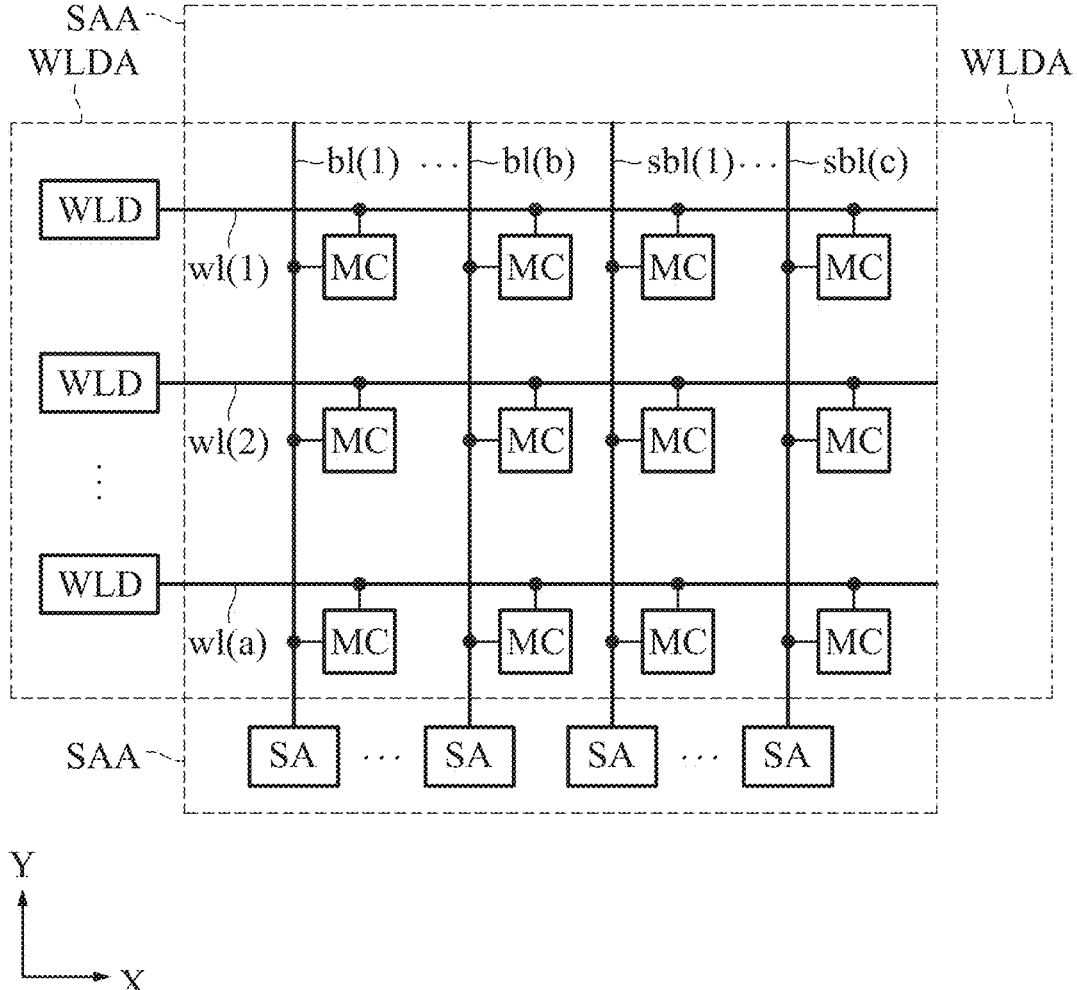
FIG. 2 shows a structural example of a subarray.

As shown in FIG. 2, multiple sense amplifiers SAs in each sense amplifier row SAA are spaced apart in the X direction, and multiple word line drivers WLDs in each word line driver row WLDA are spaced apart in the Y direction.

As shown in FIG. 2, multiple word lines w1(1), w1(2), . . . , w1(a), multiple bit lines b1(1), . . . , b1(b), multiple spare bit lines sb1(1), . . . , sb1(c), and multiple memory cells MCs are arranged in each of the subarrays A11, A12, A21, A22, where a, b and c are integers greater than or equal to 2. The multiple memory cells MCs are electrically connected to one of the multiple word lines w1(1), w1(2), . . . , w1(a), and one of the multiple bit lines b1(1), . . . , b1(b) or one of the multiple spare bit lines sb1(1), . . . , sb1 (c).

Here, each of the multiple spare bit lines sb1(1), . . . , sb1(c) is used to replace defective bit lines in the multiple bit lines b1(1), . . . , b1(b). Further, the technology of replacing a defective bit line with any spare bit line is well known, so its description is omitted in this embodiment.

Each sense amplifier SA is a circuit for driving the bit line in the multiple bit lines b1(1), . . . , b1(b) or the spare bit line in the multiple spare bit lines sb1(1), . . . , sb1(c), which is connected to the sense amplifier SA. The sense amplifier SA is configured to amplify the signal (data) at the bit line or the spare bit line, which is connected thereto, when the signal to activate the bit line or the spare bit line is input.

Each word line driver WLD is a circuit for driving the word line in the multiple word lines w1(1), w1(2), . . . , w1(a), which is connected to the word line driver WLD. The word line driver WLD is configured to drive the word line, which is connected thereto, when the signal to activate the word line is input.

Each of the multiple word lines w1(1), w1(2), . . . , w1(a) is spaced apart in the Y direction and extends along the X direction, and is electrically connected to a corresponding word line driver WLD at one side of the extending direction. Here, the one side may be the right side or left side, and in FIG. 2. is at the left side. Further, each of the multiple bit lines b1(1), . . . , b1 (b) and each of the multiple spare bit lines sb1(1), . . . , sb1(c) is spaced apart, extends along the Y direction, and crosses vertically with respect to the multiple word lines w1(1), w1(2), . . . , w1(a). In addition, each of the multiple bit lines b1(1), . . . , b1(b) and each of the multiple spare bit lines sb1(1), . . . , sb1(c) electrically connected a corresponding sense amplifier SA at one side of the extending direction Y. Here, the one side may be the upper side or lower side, and in FIG. 2 is the at the lower side.

Each of the multiple memory cell MCs is arranged at the intersection of one of the word lines w1(1), w1(2), . . . , w1(a), and one of the bit lines b1(1), . . . , b1(b) or one of the spare bit lines sb1(1), . . . , sb1(c). In addition, the structure of each memory cell MC may be the same as the traditional structure.

In addition, since the details of the data control for each memory cell MC are the same as the traditional technology, the description thereof is omitted in this embodiment.

Figure 4:
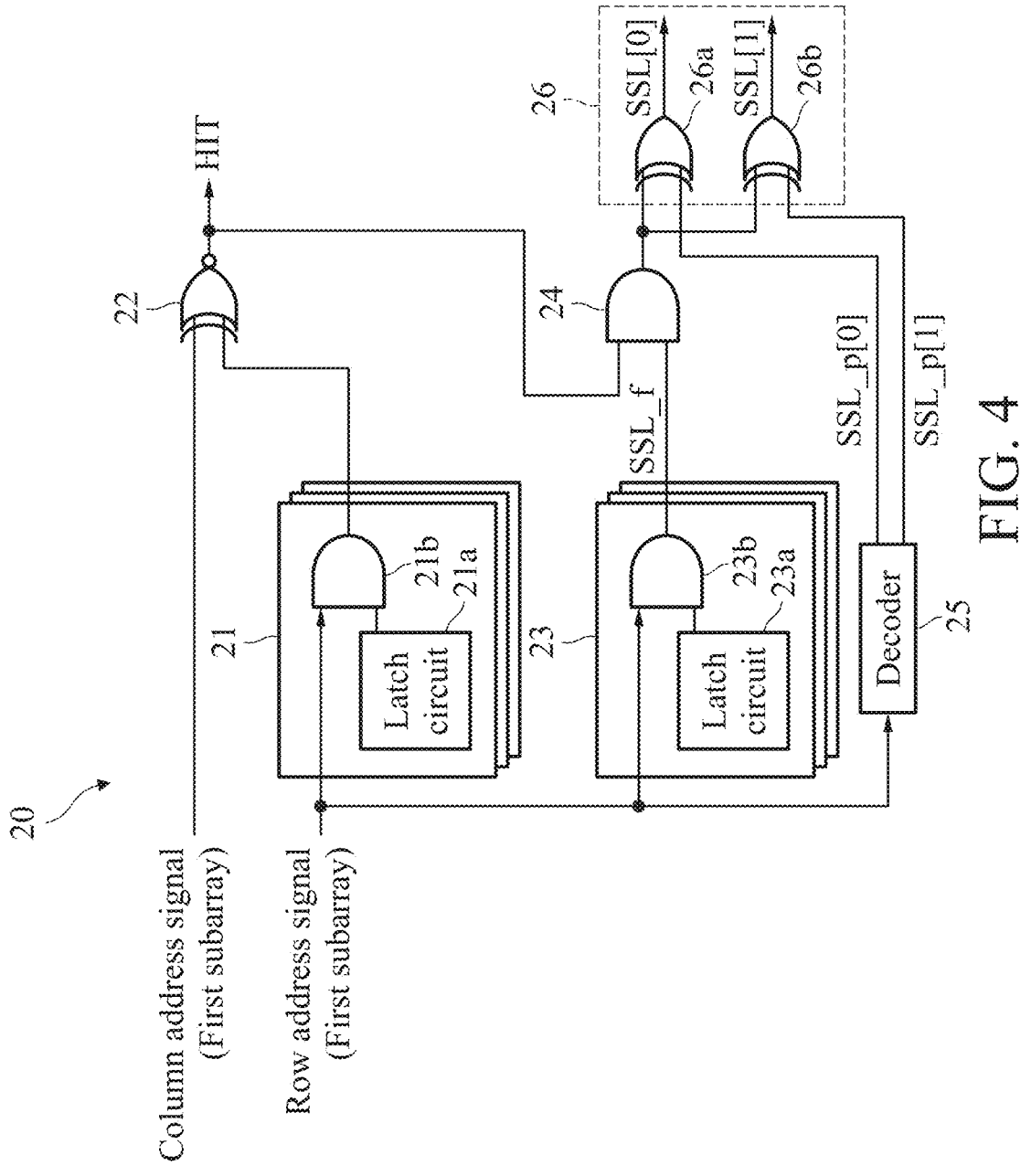
FIG. 4 is a block diagram of the control circuit of the semiconductor memory device according to the first embodiment.

In this embodiment, the semiconductor memory device includes a control circuit 20. As shown in FIG. 3 and FIG. 4, when activating one word line w1_1 of a first subarray (here, for example, the subarray A13) in the multiple subarrays (A11, A12, A13, A21, A22, A23, . . . in FIG. 3), the control circuit 20 is configured to activate the word line w1_1 and activate the word line w1_2, which is in a second subarray arranged apart from the first subarray in the Y direction (the column direction of the matrix) among the multiple subarrays.

In addition, when the condition that the number of defective bit lines in the first subarray is higher than the number of spare bit lines in the first subarray is met, the control circuit 20 is configured to access the memory cells MCs connected to the activated word line w1_2, rather than access the memory cells MCs connected to the activated word line w1_1 in the first subarray.

In addition, the information indicating the correspondence between the first subarray and the second subarray may be stored in a predetermined memory region (for example, a configuration register, etc.). Further, the information indicating the correspondence between the word lines and the bit lines in the first subarray, and the word lines and the bit lines in the second subarray may be stored in the predetermined memory region.

In addition, at least one subarray can be provided between the first subarray and the second subarray. As a result, for example, each sense amplifier SA provided in the sense amplifier row SAA between the first subarray and the second subarray can be used by the first subarray and the second subarray at the same time, thereby suppressing the difficulty in determining the memory cells MCs to be accessed in which one of the first subarray and the second subarray.

As shown in FIG. 4, the control circuit 20 includes a first memory unit 21, a XNOR (exclusive NOR gate) circuit 22, a second memory unit 23, an AND (AND gate) circuit 24, a decoder 25, and a first signal generating circuit 26.

The first memory unit 21 includes a latch circuit 21a and an AND circuit 21b for each of the multiple subarrays A11, A12, A13, A21. A22, A23. The latch circuit 21a is configured to store column addresses corresponding to the defective bit lines in the corresponding subarray. A row address signal is input to one input terminal of the AND circuit 21b. Further, a signal (indicating the column address corresponding to the defective bit line) output from the latch circuit 21a is input to the other input terminal of the AND circuit 21b. When the word line corresponding to the input row address signal is within the corresponding subarray, the AND circuit 21b outputs the signal output by the latch circuit 21a to the XNOR circuit 22.

A column address signal is input to one input terminal of the XNOR circuit 22. Further, a signal (indicating the column address corresponding to the defective bit line) output from the first memory unit 21 is input to the other input terminal of the XNOR circuit 22. The XNOR circuit 22 performs logical operation according to the input signals, and outputs the signal HIT of the operation result. Here, when the input column address signal and the column address signal corresponding the defective bit line are consistent, the signal HIT is high level, and when inconsistent, the signal HIT is low level.

The second memory unit 23 includes a latch circuit 23a and an AND circuit 23b for each of the multiple subarrays A11, A12, A13, A21. A22, A23. The latch circuit 23a is configured to store a flag signal SSL_f indicating whether to access the second subarray instead of the first subarray for each defective bit line in the first subarray. The flag signal SSL_f is an example of the "first information" of the present invention.

Here, the flag signal SSL_f can be composed of a predetermined number of bits (for example, 1 bit), and the value of the flag signal SSL_f can be set by the control circuit 20. In addition, when flag signal SSL_f is high level, it can indicate the need to access the second subarray to replace the first subarray. Namely, in the first subarray, the number of defective bit lines is more than that of the spare bit lines, and thus there is no replaceable spare bit lines. On the contrary, when the flag signal SSL_f is low level, it can indicate access the first subarray. That is, in the first subarray, the number of defective bit lines is less than that of the spare bit lines, and thus the defective bit lines can be replaced by the spare bit lines.

The row address signal is input to one input terminal of the AND circuit 23b. Further, the flag signal SSL_f output from the latch circuit 23a is input to the other input terminal of the AND circuit 23b. When the word line corresponding to the input row address signal is within the corresponding subarray, the AND circuit 23b outputs the flag signal SSL_f to the AND circuit 24.

The signal HIT output by the XNOR circuit 22 is input to one input terminal of the AND circuit 24. Further, the flag signal SSL_f is input to the other input terminal of the AND circuit 24. The AND circuit 24 performs AND operation according to the input signals, and output the signal of operation result to the first signal generating circuit 26.

When receiving the row address signal corresponding to the word line in the first subarray, the decoder 25 outputs the signal SSL_p[0] in high level to the first signal generating circuit 26, and output the signal SSL_p[1] in low level to the first signal generating circuit 26. In addition, when decoder 25 receives the row address signal corresponding to the word line to be accessed in the subarray (here is the second subarray) for replacing the first subarray, the decoder 25 outputs the signal SSL_p[0] in low level to the signal generating circuit 26 and outputs the signal SSL_p[1] in high level to the signal generating circuit 26.

When any defective bit line in the first subarray is selected, the first signal generating circuit 26 generates selection signals SSL[0] and SSL[1] for selecting the first subarray or the second array as access object, according to the flag signal SSL_f (the first information) corresponding to the selected defective bit line. SSL[0] and SSL[1] are examples of the "the first control signal" of the present invention, hereafter may collectively represented as SSL.

The first signal generating circuit 26 includes two XOR (Exclusive OR gate) circuits 26a and 26b. The signal output by the AND circuit 24 is input to one input terminal of the XOR circuit 26a, and the signal SSL_p[0] is input to the other input terminal of the XOR circuit 26a. The XOR circuit 26a performs exclusive-or operation according to the output of the AND circuit 24 and the output signal SSL_p[0] of the decoder 25, and outputs the selection signal SSL[0] as the operation result. Further, the signal output by the AND circuit 24 is input to one input terminal of the XOR circuit 26b, and the signal SSL_p[1] is input to the other input terminal of the XOR circuit 26b. The XOR circuit 26b performs exclusive-or operation according to the output of the AND circuit 24 and the output signal SSL_p[1] of the decoder 25, and outputs the selection signal SSL[1] as the operation result.

Here, when the selection signal SSL[0] is high level, the first subarray is selected as the access object. On the other hand, when the selection signal SSL[1] is high level, the second subarray is selected as the access object, instead of the first subarray.

Figure 5A:
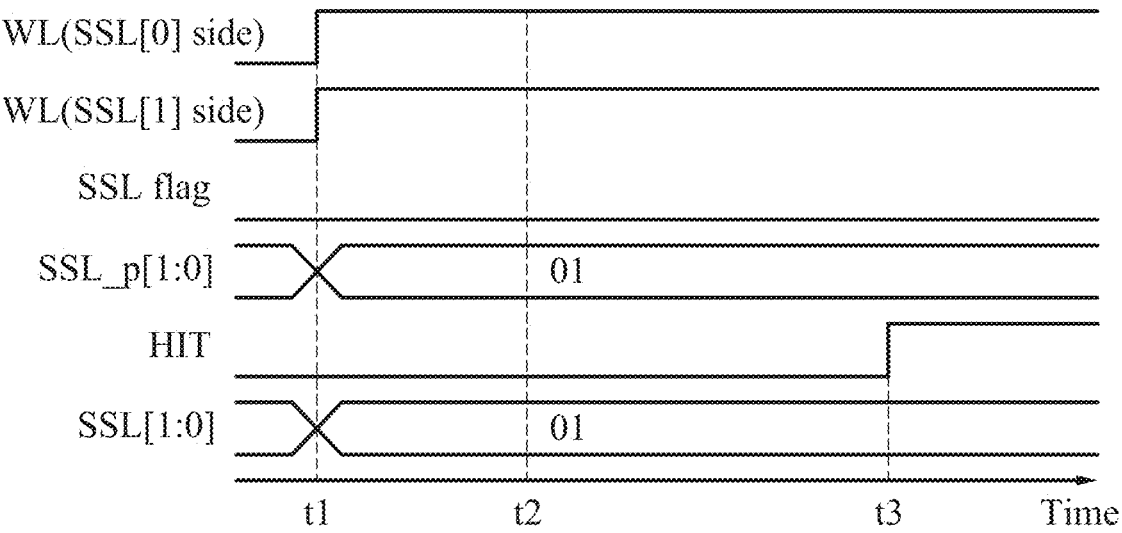
FIG. 5A and FIG. 5B are timing charts schematically showing examples of signal time conversion.
Figure 5B:
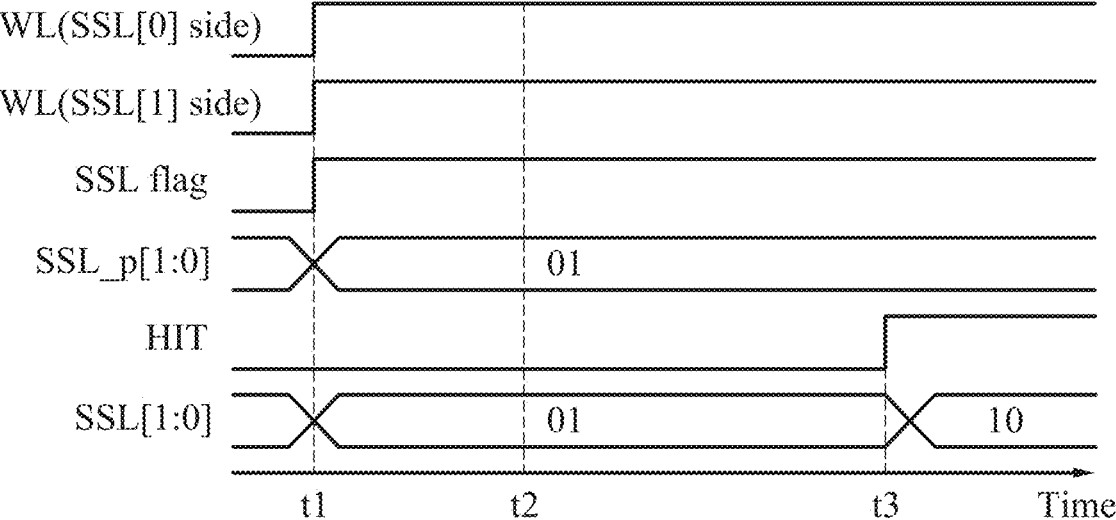

Next, referring to FIG. 5A and FIG. 5B, two operation examples of the semiconductor memory device of this embodiment will be described. Here, FIG. 5A shows one operation example to access the memory cell MC connected to a spare bit line in the first subarray which replaces the defective bit line in the first subarray when the memory cell MC connected to the defective bit line in the first subarray (the subarray A13) is accessed. FIG. 5B shows another operation example to access the memory cell MC connected to the bit line in the second subarray (the subarray A11) which replaces the first subarray when the memory cell MC connected to the defective bit line in the first subarray (the subarray A13) is accessed.

Please refer to FIG. 5A. At time t1, when a word line activation command including a row address signal is input from the external, the control circuit 20 activates (sets to high level) the word line (WL (SLL[0]) side) in the subarray A13 corresponding to the row address indicated by the row address signal, as well as activates the corresponding word line (WL(SLL [1]) side) in the subarray A11.

At this moment, when the first memory unit 21 of the control circuit 20 receives the row address signal, it outputs the column address of the defective bit line in the subarray A13. Further, when the first memory unit 21 of the control circuit 20 receives the row address signal, it outputs the flag signal SSL_f of the defective bit line in the subarray A13.

At time t2, assume that a read command for reading the memory cell MC connected to a normal bit line (a bit line that does not have a defect) is input from the external. In this situation, since the column address corresponding to the normal bit line included in the read command is not consistent with the column address of the defective bit line output from the first memory unit 21 of the control circuit 20, the signal HIT is low level. Further, since the signal HIT is low level, the selection signal SSL[0] becomes high level, and the selection signal SSL[1] becomes low level. Therefore, the control circuit 20 selects the subarray A13 as an access object and reads the memory cell MC connected to the normal bit line in the subarray A13.

At time t3, assume that a read command for reading the memory cell MC connected to a defective bit line is input from the external. In this situation, since the column address corresponding to the defective bit line included in the read command is consistent with the column address of the defective bit line output from the first memory unit 21 of the control circuit 20, the signal HIT is high level. On the other hand, since the flag signal SSL_f output from the second memory unit 23 of the control circuit 20 is low level, which indicates that there is no need to access the second subarray instead of the first subarray, the selection signal SSL[0] becomes high level, and the selection signal SSL[1] becomes low level. Therefore, the control circuit 20 selects the subarray A13 as the access object and reads the memory cell MC connected to the spare bit line instead of the defective bit line in the subarray A13.

Please refer to FIG. 5B. The operations at time t1 and time t2 are the same as the operations at time t1 and time t2 in FIG. 5A. At time t3, assume that a read command for reading the memory cell MC connected to the defective bit line is input from the external. In this case, since the column address of the defective bit line included in the read command and the column address of the defective bit line output from the first memory unit 21 of the control circuit 20 is consistent, the signal HIT is high level. On the other hand, since the flag signal SSL_f output from the second memory unit 23 of the control circuit 20 is high level, which indicates that it is necessary to access the second subarray instead of the first subarray, the selection signal SSL [0] becomes low level, and the selection signal SSL[1] becomes high level. Therefore, the control circuit 20 selects the subarray A11 as the access object instead of the subarray A13 and reads the memory cell MC connected to the corresponding bit line in the subarray A11.

In this way, even the number of defective bit lines in the subarray A13 is higher than the number of the spare bit lines in the subarray A13, the memory cells MC in the subarray A11 can be accessed to replace the memory cells MC in the subarray A13.

In addition, when the first condition that the number of defective bit lines in the first subarray (subarray A13) is higher than that of the spare bit lines in the first subarray (subarray A13) is met, the control circuit 20 selects one sense amplifier SA connected to any bit line or spare bit line in the subarray A11 to replace the sense amplifier SA connected to any bit line or spare bit line in the subarray A13, so as to access the memory cells MC connected to the activated word line in the subarray A11. Therefore, The memory cells MC in the subarray A11 can be accessed to replace the memory cells MC in the subarray A13.

Figures 6A, 6B:
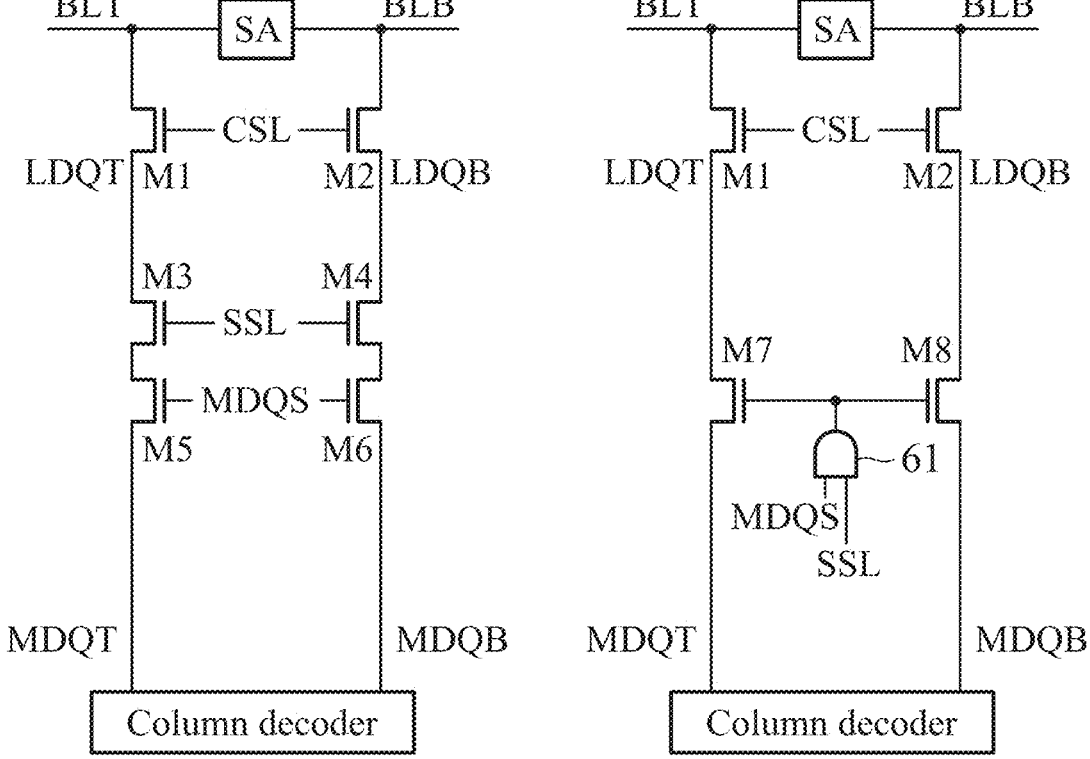
FIG. 6A and FIG. 6B respectively show the structures arranged between the sense amplifier and the column decoder.

Referring to FIG. 6A and FIG. 6B, an exemplary configuration of the control circuit 20 for selecting sense amplifier SA is described. First, as shown in FIG. 6A, the control circuit 20 further includes a pair of N-type MOS-FETs (Metal-Oxide-Semiconductor Field-Effect Transistor) M1 and M2 whose gate terminals receives the column selection signal CSL corresponding to the column address from the external, a pair of N-type MOSFETs M3 and M4 whose gate terminals receive the selection signal SSL (an example of "the first control signal" in the present invention), and a pair of N-type MOSFETs M5 and M6 whose gate terminals receive the signal MDQS. N-type MOSFETs M1, M3 and M5 are serially connected between the bit line BLT and the column decoder. N-type MOSFETs M2, M4 and M6 are serially connected between the bit line BLB and the column decoder. The sense amplifier SA is connected with a pair of complementary bit lines BLT and BLB. The pair of complementary bit lines BLT and BLB is connected to a pair of complementary local data lines LDQT and LDQB through the pair of N-type MOSFETs M1 and M2. The pair of complementary local data lines LDQT and LDQB are connected to a pair of complementary main data lines MDQT and MDQB through the pair of N-type MOS-FETs M3 and M4 and the pair of N-type MOSFETs M5 and M6. Here, the signal MDQS is a switching signal between the pair of complementary local data lines LDQT, LDQB and the pair of complementary main data lines MDQT, MDQB. The pair of complementary main data lines MDQT and MDQB are connected to the column decoder.

When accessing the memory cells in the subarray A11 instead of the subarray A13, the control circuit 20 outputs the selection signal SSL in low level to the subarray A13, and outputs the selection signal SSL in high level to the subarray A11. In addition, the control circuit 20 outputs the column selection signal CSL in high level and the signal MDQS in high level to the subarray A11. By this way, the control circuit 20 can select the sense amplifier SA of the subarray A11 to access the memory cells in the subarray A11.

Further, to reduce the number of N-type MOSFETs between the pair of complementary local data lines LDQT, LDQB and the pair of complementary main data lines MDQT, MDQB, as shown in FIG. 6B, in the control circuit 20, instead of adopting four N-type MOSFETs M3 to M6, a pair of N-type MOSFETs M7 and M8, whose gate terminals are connected to an output of an AND circuit 61, can be provided between the pair of complementary local data lines LDQT, LDQB and the pair of complementary main data lines MDQT, MDQB. The AND 61 circuit receives the signal MDQS and the selection signal SSL.

In some embodiments, when the first condition that the number of defective bit lines in the first subarray (subarray A13) is higher than that of the spare bit lines in the first subarray (subarray A13) is met, the control circuit 20 can select the sub-amplifier SUBA connected to the sense amplifier SA to which any bit line or spare bit line in the second subarray (the subarray A11) is connected, to replace the sub-amplifier SUBA connected to the sense amplifier SA to which any bit line or spare bit line in the first subarray (the subarray A13) is connected. In this way, the memory cells MC connected to the activated word line in the subarray A11 can be accessed. Therefore, the memory cells in the subarray A11 can be accessed to replace the memory cells MC in the subarray A13.

Figures 7A, 7B:
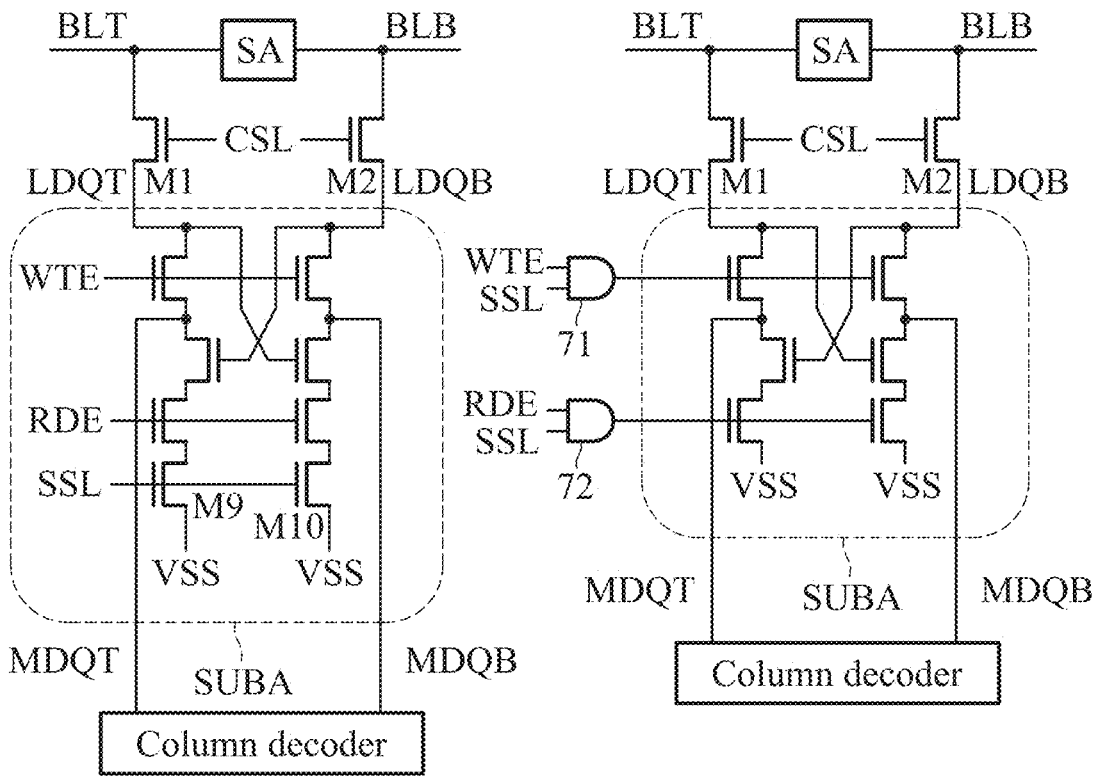
FIG. 7A and FIG. 7B respectively show the structures of the sub-amplifiers arranged between the sense amplifier and the column decoder.

Referring to FIG. 7A and FIG. 7B, the exemplary configuration of the control circuit 20 to select the sub-amplifier SUBA is described. First, as shown in FIG. 7A, the control circuit 20 can include the sub-amplifier SUBA, so as to connect the pair of complementary local data lines LDQT, LDQB to the pair of complementary main data lines MDQT, MDQB through the sub-amplifier SUBA. Here, the sub-amplifier SUBA may have the same configuration as a conventional sub-amplifier except that a pair of N-type MOSFETs M9 and M10 whose gate terminals receive the selection signal SSL are provided in this embodiment.

When accessing the memory cells MC of the subarray A11 instead of the subarray A13, the control circuit 20 outputs the selection signal SSL in low level to the subarray A13 and outputs the selection signal SSL in high level to the subarray A11. In addition, he control circuit 20 can output the column selection signal CSL in high level to the subarray A11 to control the signal RDE for data reading and the signal WTE for data writing. Therefore, the control circuit 20 can select the sub-amplifier SUBA of the subarray A11 for accessing the memory cells MC in the subarray A11.

In an alternative embodiment, as shown in FIG. 7B, instead of arranging the pair of N-type MOSFETs M9 and M10, the control circuit 20 can include an AND circuit 71 for receiving the signal WTE and the selection signal SSL, and an AND circuit 72 for receiving the signal RDE and the selection signal SSL. The outputs of the AND circuits 71 and 72 are coupled to the gate terminals of the N-type MOSFETs in the sub-amplifier SUBA.

As mentioned above, the semiconductor memory device and the control method thereof, even when the number of defective bit lines in subarray A13 is higher than the number of spare bit lines in subarray A13, the memory cells MC in the subarray A11 can be accessed instead of the memory cells MC in the subarray A13. Therefore, even the number of defective bit lines of any subarray (here is the subarray A13) of the multiple subarrays exceeds the number of spare bit lines provided in the subarray A13, the defective bit lines can be rescued.

In addition, in this embodiment, the control circuit 20 includes the second memory unit 23 to store the flag signal SSL_f, and the first signal generating circuit 26 to generate the selection signals SSL[0], SSL[1] for selecting the subarray A13 of the subarray A11 as the access object based on the flag signal SSL_f. Therefore, the flag signal SSL_f can be used to easily determine which one of the subarray A13 and the subarray A11 is to be accessed.

The following describes the semiconductor memory device and its control method according to the second embodiment of the present invention. When the predetermined second condition that the number of defective bit lines in the second subarray (subarray A11) is higher than the number of spare bit lines in subarray A11 is met, the control circuit 20 is configured to access the memory cells MC connected to the activated word line in the third subarray (A21), which is spaced apart from the subarray A11 of the multiple subarrays in the X direction, to replace the memory cells MC connected to the activated word line in the subarray A11. This configuration is different from that of the first embodiment. Configurations different from those of the first embodiment will be explained below.

In this embodiment, when the second condition is met, the control circuit 20 is configured to connect any bit line or spare bit line in the third subarray (subarray A21) to the local data lines LDQs connected to any bit line or spare bit line in the subarray A11, and thereby any bit line or spare bit line in the second subarray (subarray A11) can be replaced by accessing the memory cells MC connected to the activated word lines in the subarray A21. Therefore, the memory cells MC in the subarray A21 can be accessed to replace memory cells MC in the subarray A11.

Figure 8:
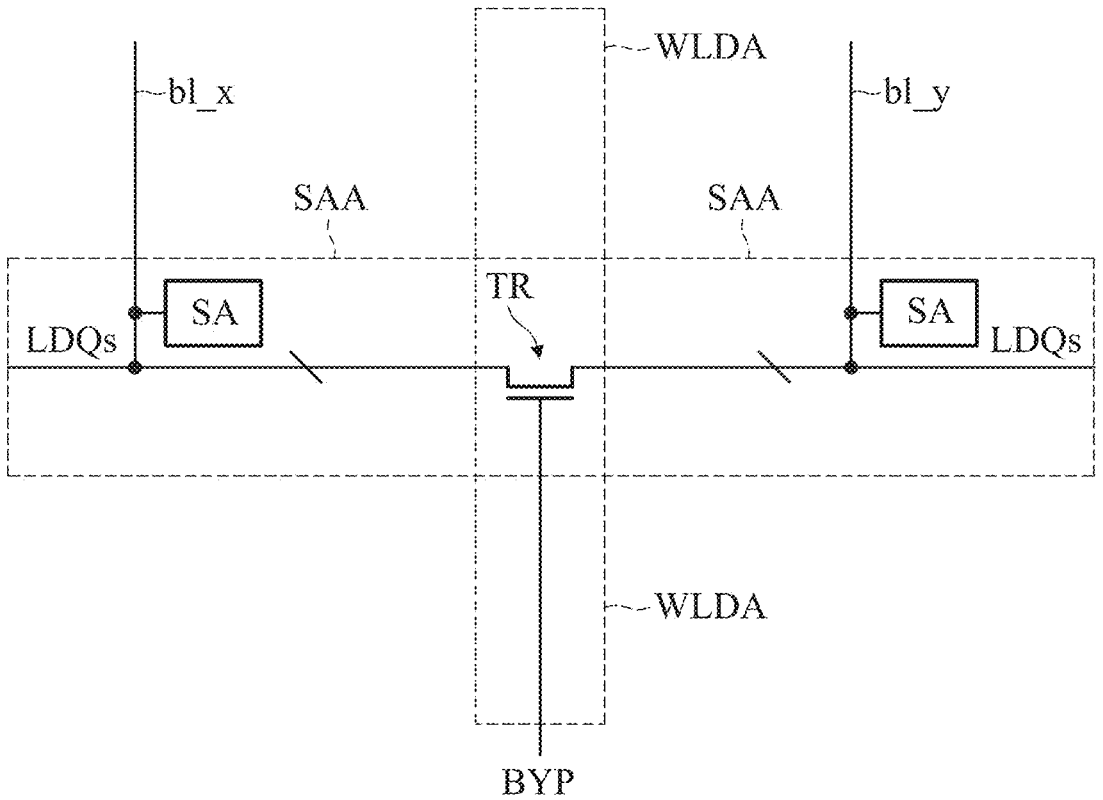
FIG. 8 shows a structural example of a switching circuit provided in the memory cell array of a semiconductor memory device, according to a second embodiment of the present invention.

As shown in FIG. 8, a switching circuit is provided in this embodiment, to connect the local data lines LDQs in the first sense amplifier row SAA of the multiple sense amplifier rows SAAs and the local data lines LDQs in the second sense amplifier row SAA adjacent to the first sense amplifier row SAA. Here, the switching circuit may be a N-type MOSFET TR whose gate terminal receives a bypass signal BYP. Further, the bypass signal BYP is an example of a second control signal for selecting either the second subarray (subarray A11) or the third subarray (subarray A21) as the access object.

When the second condition is met, the control circuit 20 outputs the bypass signal BYP in high level, and the local data lines LDQs in the sense amplifier row SAA adjacent to the subarray A21 (including the bit line b1_y in the example of FIG. 8) is connected to the local data lines LDQs in the sense amplifier row SAA adjacent to the subarray A11 (including the bit line b1_x in the example of FIG. 8). Therefore, the local data lines LDQs in the sense amplifier row SAA adjacent to the subarray A21 can be connected to the local data lines LDQs in the sense amplifier row SAA adjacent to the subarray A11 through the switching circuit. In addition, although only one local data line LDQ is shown in FIG. 8, as explained with reference to FIG. 6A and FIG. 6B and FIG. 7A and FIG. 7B, for example, when the sense amplifier SA is connected to the pair of complementary bit lines BLT and BTB, the pair of complementary local data lines LDQT and LDQB connected to the pair of complementary bit lines BLT and BLB may be provided in the sense amplifier row SAA. In this case, a switching circuit may be provided for each of the pair of complementary bit lines BLT and BLB.

Figure 9:
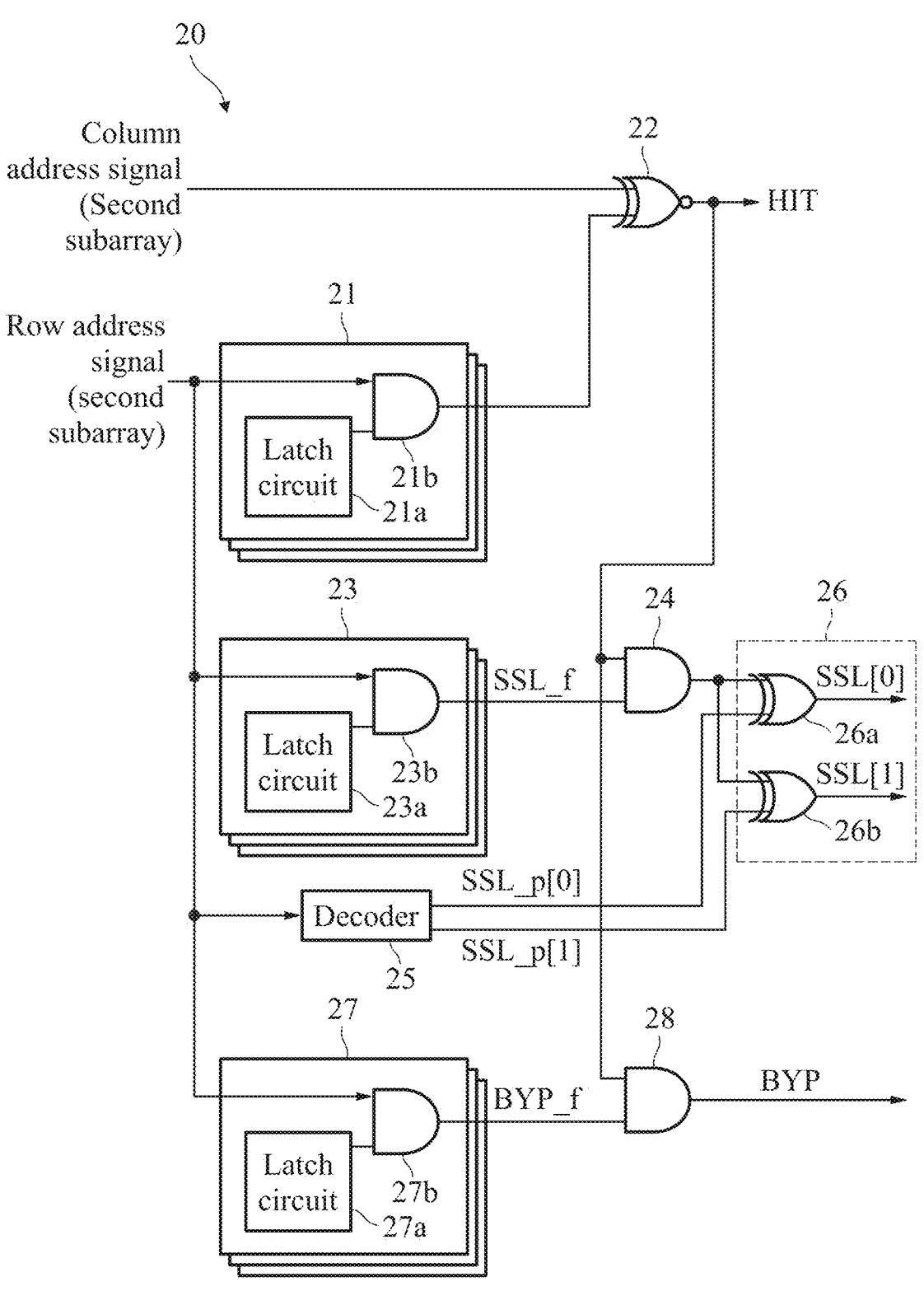
FIG. 9 is a block diagram of the control circuit of the semiconductor memory device according to the second embodiment.

Referring to FIG. 9, the configuration of the control circuit 20 according to this embodiment is described. The control circuit 20 includes a first memory unit 21, a XNOR circuit 22, a second memory unit 23, an AND circuit 24, a decoder 25, a first signal generating circuit 26, a third memory unit 27, and a second signal generating circuit 28. Here, the first memory unit 21, the XNOR circuit 22, the second memory unit 23, the AND circuit 24, the decoder 25, the first signal generating circuit 26 have the same configurations as described in the first embodiment.

Here, in the first embodiment, the row address signal corresponding to the bit line in the first subarray (subarray A13), and the column address signal corresponding the bit line and spare bit line, are input from the external to the control circuit 20. In contrast, in this embodiment, in order to access the second subarray (subarray A11) instead of the first subarray (subarray A13), the row address signal corresponding to the word line in the second subarray (subarray A11), and the column address signal corresponding to the bit line and spare bit line are input to the control circuit 20.

The third memory unit 27 includes a latch circuit 27a and an AND circuit 27b for each of the multiple subarrays A11, A12, A13, A21. A22, A23. The latch circuit 27a is configured to store the flag signal BYP_f (an example of "the second information" in the present invention). The flag signal BYP_f indicates whether to access the third subarray to replace the second subarray for each defective bit line in the corresponding subarray.

Here, the flag signal BYP_f can be composed of a predetermined number of bits (for example 1 bit), and the value of the flag signal BYP_f can be set by the control circuit 20. In addition, when the flag signal BYP_f is high level, it can indicate the need to access the third subarray to replace the second subarray. That is, in the second subarray, the number of defective bit lines is higher than that of the spare bit lines, and thus there is no replaceable spare bit line). On the contrary, when the flag signal BYP_f is low level, it can indicate access the second subarray. That is, in the second subarray, the number of defective bit lines is less than that of the spare bit lines, and thus the defective bit lines can be replaced by the spare bit lines.

One input terminal of the AND circuit 27b receives the row address signal, while the other input terminal of the AND circuit 27b receives the flag signal BYP flag output from the latch circuit 27a. When the word line corresponding to the input row address signal is included in one of the multiple subarrays, the corresponding AND circuit 27b outputs the flag signal BYP_f to the second signal generating circuit 28.

The second signal generating circuit 28 is composed of an AND circuit, and is configured to receive the signal HIT output from the XNOR circuit 22 and the flag signal BYP_f. The second signal generating circuit 28 performs AND operation and outputs the operation result as the bypass signal BYP.

In this case, the control circuit 20 receives the column address signal corresponding to the defective bit lines in the second subarray (subarray A11), and when the flag signal BYP_f corresponding to the defective bit lines is set to the high level, the bypass signal BYP becomes high level. Therefore, the control circuit 20 selects the third subarray (subarray A21) as the access object to replace the second subarray A11, and then accesses the memory cells MC connected to the corresponding bit line in the third subarray A21.

As mentioned above, according to the semiconductor device and its control method of the present invention, even when the number of defective bit lines in the second subarray A11 is more than the spare bit lines in the second subarray A11 the memory cells MC in the third subarray A21 can be accessed to replace the memory cells MC in the second subarray A11. Therefore, the defective bit lines of the first subarray (subarray A13) can be more reliably rescued.

In addition, in this embodiment, the control circuit 20 further includes the third memory unit to store flag signal BYP_f, and the second signal generating circuit 28 to generate the bypass signal BYP for selecting any of the second subarray A11 and the third subarray A21 as the access object, and therefore it can easily determine that which one of the second subarray A11 and the third subarray A21 is to be accessed.

The embodiments described above are to make the present invention easier to be understood, but are not intended to limit the present invention. Therefore, the main points disclosed in the above embodiments are intended to include all design changes and equivalents that fall within the technical scope of the present invention.

In the above embodiments, when activating any word line in the first subarray (ex. A13) of the multiple subarrays A11, A12, A13, A21, A22, A23, . . . , the control circuit 20 activates the word line and the corresponding word line in the second word array (ex. A11). However, this is just an example for description, the present invention is not limited thereto. For example, only when any word line in a specific subarray (ex. A12) among the multiple subarrays A11, A12, A13, A21, A22, A23, . . . is activated, the control circuit 20 activates the corresponding word lines of other subarrays. When any word line in another subarray (ex. A13) is activated, it is not necessary to activate the corresponding word line in the other subarray (ex. A11). In addition, information related to a specific subarray, for example, can be set in a predetermined memory region (such as a configuration register, etc.). Therefore, the increase in power consumption caused by simultaneously activating word lines of more than two subarrays can be reduced.

In addition, in the above second embodiment, the second subarray A11 and the third subarray A21 are adjacent to each other as an example, but this is not intended to limit the present invention to this situation. For example, one or more subarrays may be provided between the second subarray and the third subarray. In this situation, when the number of defective bit lines in the second subarray is higher than the number of spare bit lines in the second subarray, the memory cells in the third subarray can be accessed to replace the memory cells of the second subarray.

In addition, the configuration of the control circuit 20 in each of the above embodiments is an example, and may be appropriately changed and other various configurations may be adopted.

The present invention is suitable for manufacturing miniaturized semiconductor memory devices to increase the total number of dies on the wafer. Therefore, the present invention can reduce the production cost and energy consumption of manufacturing a single IC, and reduce the production energy consumption of subsequent packaging, thereby reducing carbon emissions in the production process of semiconductor memory devices. In addition, since the reliability and repair efficiency of the semiconductor memory device of the present invention are improved and power consumption can be reduced, the present invention provides a green semiconductor technology.

What is claimed is:

1. A semiconductor memory device, comprising:
a memory cell array, including a first subarray and a second subarray arranged apart from the first subarray in a column direction, each of the first subarray and the second subarray including a plurality of word lines, a plurality of bit lines, at least one spare bit line for replacing at least one defective bit line, and a plurality of memory cells connected to the word lines, and the bit lines or the at least one spare bit line; and
a control circuit, coupled to the memory cell array, and configured to activate one of the plurality of word lines in the first subarray and a corresponding one of the plurality of word lines in the second subarray when receives a read command for reading the one of the plurality of word lines in the first subarray;
wherein in the first subarray when the number of the defective bit lines is higher than the number of the at least one spare bit line, the control circuit is configured to access the memory cells connected to the activated corresponding one of the plurality of word lines in the second subarray instead of the first subarray;
wherein the control circuit further comprises:
a first signal generating circuit, configured to generate a first control signal when the at least one defective bit line in the first subarray is selected, for selecting the first subarray or the second subarray as an access object, according to first information corresponding to the selected defective bit line that indicates whether to access the second subarray to replace the first subarray.

2. The semiconductor memory device as claimed in claim 1, wherein the memory cell array further includes a third subarray, and the control circuit does not activate a corresponding one of the plurality of word lines in the third subarray when receives the read command for reading the one of the plurality of word lines in the first subarray.

3. The semiconductor memory device as claimed in claim 1, wherein the control circuit further comprises:
a first memory unit configured to store at least one column address corresponding to the at least one defective bit line; and
a second memory unit, storing the first information.

4. The semiconductor memory device as claimed in claim 3, further comprising a first sense amplifier connected to the first subarray, and a second sense amplifier connected to the second subarray,
wherein the control circuit accesses the memory cells connected to the activated corresponding one of the plurality of word lines in the second subarray by selecting the second sense amplifier instead of the first sense amplifier.

5. The semiconductor memory device as claimed in claim 4, further comprising a column decoder,
wherein the control circuit includes a pair of N-type MOSFETs whose gate terminals receive the first control signal, each of the pair of N-type MOSFETs is coupled between the column decoder and one of the first sense amplifier and the second sense amplifier.

6. The semiconductor memory device as claimed in claim 4, further comprising a column decoder, wherein the control circuit includes:
a pair of N-type MOSFETs coupled between the column decoder and one of the first sense amplifier and the second sense amplifier; and
an AND circuit receives the first control signal and a switching signal between a pair of complementary local data lines and a pair of complementary main data lines, and the gate terminals of the pair of N-type MOSFETs are coupled to the output of the AND circuit.

7. The semiconductor memory device as claimed in claim 3, wherein the control circuit further comprises:

an XNOR circuit, coupled to the first memory unit, and configured to receive a column address signal and the at least one column address corresponding to the at least one defective bit line, and outputs a HIT signal indicating whether the received column address signal and the least one column address corresponding to the at least one defective bit line match;

an AND circuit, coupled to the second memory unit and an output of the XNOR circuit for receiving the first information and the HIT signal, and coupled to the first signal generating circuit for providing an AND operation result of the first information and the HIT signal; and a decoder, receiving a row address signal corresponding to the activated one of the plurality of word lines in the first subarray or the activated corresponding one of the plurality of word lines in the second subarray, and configured to output a pair of complementary signals to the first signal generating circuit.

8. The semiconductor memory device as claimed in claim 3, further comprising a first sense amplifier connected to the first subarray, and a second sense amplifier connected to the second subarray, wherein the control circuit accesses the memory cells connected to the activated corresponding one of the plurality of word lines in the second subarray by selecting a second sub-amplifier connected to the second sense amplifier instead of a first sub-amplifier connected to the first sense amplifier.

9. The semiconductor memory device as claimed in claim 8, further comprising a column decoder, wherein the first sub-amplifier is coupled between the column decoder and the first sense amplifier, the second sub-amplifier is coupled between the column decoder and the second sense amplifier, wherein the control circuit further comprises a first AND circuit for receiving the signal for data writing and the first control signal, and a second AND circuit for receiving the signal for data reading and the first control signal, and outputs of the first AND circuit and the second AND circuit are coupled to the gate terminals of N-type MOSFETs in the first sub-amplifier and the second sub-amplifier.

10. The semiconductor memory device as claimed in claim 3, wherein the memory cell array further includes a third subarray arranged apart from the second subarray in the column direction, when the number of the defective bit lines in the second subarray is higher than the number of the at least one spare bit line in the second subarray, the control circuit accesses the memory cells connected to the activated corresponding one of the plurality of word lines in the third subarray, to replace the memory cells connected to the activated corresponding one of the plurality of word lines in the second subarray.

11. The semiconductor memory device as claimed in claim 10, wherein the control circuit further comprises:

a third memory unit, storing second information that indicates whether to access the third subarray to replace the second subarray; and a second signal generating circuit, configured to generate a second control signal when the at least one defective bit line in the second subarray is selected, for selecting the second subarray or the third subarray as the access object, according to the second information corresponding to the selected defective bit line.

12. The semiconductor memory device as claimed in claim 11, wherein the control circuit accesses the memory cells connected to the activated corresponding one of the plurality of word lines in the third subarray by connecting one of the plurality of bit lines or the at least one spare bit line in the third subarray instead of the second subarray, to a local data line connected to the second subarray.

13. The semiconductor memory device as claimed in claim 12, wherein the control circuit further comprises a switching circuit receiving the second control signal, and is configured to connect one of the plurality of bit lines or the at least one spare bit line in the third subarray to the local data line connected to the second subarray.

14. The semiconductor memory device as claimed in claim 1, wherein at least one subarray is provided between the first subarray and the second subarray.

15. A control method of a semiconductor memory device having a memory cell array including a first subarray and a second subarray arranged apart from the first subarray in a column direction, comprising:

activating a word line in the first subarray and a corresponding word line in the second subarray when receives a read command for reading the word line in the first subarray; and accessing a plurality of memory cells connected to the activated corresponding word line in the second subarray instead of the first subarray when the number of defective bit lines in the first subarray is higher than the number of at least one spare bit line in the first subarray;

when selecting the defective bit line in the first subarray, generating a first control signal to select the first subarray or the second subarray as an access object, according to first information corresponding to the selected defective bit line that indicates whether to access the second subarray to replace the first subarray.

16. The control method as claimed in claim 15, wherein the memory cell array further includes a third subarray, and the control method further comprises:

not activating a corresponding word line in the third subarray when receives a read command for reading the word line in the first subarray.

17. The control method as claimed in claim 15, further comprising:

storing the first information.

18. The control method as claimed in claim 15, wherein the memory cell array further includes a third subarray arranged apart from the second subarray in the column direction, and the control method further comprises:

accessing the memory cells connected to an activated word line in the third subarray, to replace the memory cells connected to the activated corresponding word line in the second subarray when the number of the defective bit lines in the second subarray is higher than the number of the at least one spare bit lines in the second subarray.

19. The control method as claimed in claim 18, wherein accessing the memory cells connected to an activated word line in the third subarray includes connecting a bit line or the at least one spare bit line in the third subarray instead of the second subarray to a local data line connected to the second subarray.

20. The control method as claimed in claim 18, further comprising:

storing second information that indicates whether to access the third subarray to replace the second subarray; and when the at least one defective bit line in the second subarray is selected, generating a second control signal to select the second subarray or the third subarray as an access object, according to the second information corresponding to the selected defective bit line.

\* \* \* \* \*